United States Patent [19]

Galbraith

[11] Patent Number: 4,843,264
[45] Date of Patent: Jun. 27, 1989

[54] DYNAMIC SENSE AMPLIFIER FOR CMOS STATIC RAM

[75] Inventor: Douglas C. Galbraith, Fremont, Calif.

[73] Assignee: Visic, Inc., San Jose, Calif.

[21] Appl. No.: 125,293

[22] Filed: Nov. 25, 1987

[51] Int. Cl.[4] .................. G01R 19/00; H03K 3/26; H03K 17/16; G11C 7/02
[52] U.S. Cl. .................. 307/530; 307/350; 307/443; 307/279; 365/207; 365/154
[58] Field of Search ............ 307/530, 443, 350, 351, 307/355, 364, 279; 365/207, 190, 154, 238

[56] References Cited

U.S. PATENT DOCUMENTS

| | | | |
|---|---|---|---|
| 3,879,621 | 4/1975 | Cavaliere et al. | 365/207 |
| 3,953,839 | 4/1976 | Dennison et al. | 365/154 |
| 4,053,873 | 10/1977 | Freeman et al. | 307/530 |
| 4,169,233 | 9/1979 | Haraszti | 307/530 |
| 4,694,205 | 9/1987 | Shu et al. | 307/355 |
| 4,716,320 | 12/1987 | McAdams | 307/443 |

FOREIGN PATENT DOCUMENTS 8001730 8/1980 PCT Int'l Appl. ................. 307/355

Primary Examiner—John S. Heyman
Assistant Examiner—Trong Quang Phan
Attorney, Agent, or Firm—Flehr, Hohbach, Test, Albritton & Herbert

[57] ABSTRACT

A sense amplifier for use in a CMOS static random access memory. The core of the sense amplifier comprises seven transistors: two sensing transistors with their sources coupled to a common pull down node, a pull down transistor for drawing current from the pull down node during sensing operations, and a four transistor latch coupled to the drains of the two sensing transistors. The four transistor latch comprises two cross coupled CMOS inverters. When the pull down transistor is activated, the four transistor latch automatically amplifies the voltage differential on the gates of the two sensing transistors, typically latching in less than two nanoseconds. Since the latch is made up of CMOS inverters, no d.c. current is drawn by the sense amplifier after the input data has been sensed and latched. As a result, relatively powerful transistors can be used in the sense amplifier. The use of powerful transistors to produce differential output signals significantly reduces the amount of circuitry needed in the output driver of the memory device incorporating this sense amplifier. Furthermore, this sense amplifier significantly improves the access time of a memory device by enabling sensing with very small input signals from a memory cell, and by reducing the delay between sensing and providing an external data output signal.

9 Claims, 4 Drawing Sheets

DYNAMIC SENSE AMPLIFIER FOR CMOS STATIC RAM

The present invention relates generally to semiconductor memory devices, and particularly to the sense amplifiers used in MOS static random access memories.

BACKGROUND OF THE INVENTION

As the density of fast, static MOS random access memories (RAMs) continues to increase, it has become increasingly difficult to use the standard sense amplifier designs used in less dense memory devices. The use of smaller memory cells and the use of common data out lines coupled to bit lines by selected transfer devices have reduced the differential signal available for sensing. Furthermore, with increasing density, the current drawn by the prior art sense amplifiers has become more critical.

Referring to FIG. 1, there is shown the basic schematic of a differential sense amplifier used in many static RAM (random access memory) devices. To focus attention on the relevant features, the precharge circuitry has been left off. However, it may be noted that prior to sensing, node SE is low and nodes IN and INB are precharged to a high level, typically $V_{cc}$ or $V_{cc}-|V_t|$, where $V_{cc}$ is the power supply voltage and $V_t$ is the threshold of the transistors being used.

During a memory access cycle, a differential signal is generated by a memory cell on IN and INB, and SE goes high to cause the sense amplifier to sense or amplify the input signal.

The sense amplifier shown in FIG. 1 has several problems which become more important as memory density increases. First, the sense amplifier consumes d.c. power when SE is high because all of the devices in the sense amplifier are on. In other words, $|V_{GS}|>|V_t|$ for all of the transistors in the sense amplifier. To reduce the power consumed, the device sizes must be reduced, which increases the response time and the output drive of the circuit.

Second, if device M5 is not sufficiently large, devices M2, M4 and M5 will act as a voltage divider (i.e., the sense amplifier will have poor gain). As a result, the output voltage on node N2 cannot reach either $V_{cc}$ or $V_{ss}$. Thus, a buffer inverter is often added to "square up" the output of the sense amplifier.

Finally, the sense amplifier in FIG. 1 only has a single output, which in some applications is not desirable for driving output circuits.

Referring to FIGS. 2 and 3, there are shown two additional prior art sense amplifier designs, using two or more stages to provide differential outputs. The differential input signal required to produce a large output voltage swing in these sense amplifiers is typically 0.5 volts unless additional stages are added to the sense amplifier. However, in fast SRAMs (static RAMs), the time to develop such a large differential signal from the selected memory cell is usually costly in terms of speed or die size. A typical SRAM develops a differential signal at 50 millivolts per nanosecond. Therefore it can take 10 nanoseconds before there is enough signal on the bit lines (or common data out lines) to enable the sense amplifier to reliably sense the input signal.

The present invention provides a dynamic sense amplifier with the following features, which provide improved performance and reliability. First, the sense amplifier draws no d.c. current after latching, and which can reliably sense and latch very small voltage differentials (typically 50 to 100 millivolts is sufficient) at very high speeds. The present invention accomplishes this by using a circuit that has a very low intrinsic load (i.e., on the internal nodes of the device), and by using dynamic circuitry to reduce the power consumed. The fast latching provided by the sense amplifier improves its noise immunity by reducing the amount of time during which sensing is performed. The present invention also uses a circuit configuration which reduces its sensitivity to transistor gain nonuniformities compared to prior art sense amplifiers. Finally, the sense amplifier of the present invention uses a two stage amplifier in which the two stages simultaneously amplify the input signal, with the second stage coupled to the first so that it can be scaled or sized to drive relatively large loads without significantly slowing down the operation of the sense amplifier.

SUMMARY OF THE INVENTION

In summary, the present invention is a dynamic sense amplifier for use in a CMOS static random access memory. The core of the sense amplifier comprises seven transistors: two sensing transistors with their source coupled to a common pull down node, a pull down transistor for drawing current from the pull down node during sensing operations, and a four transistor latch coupled to the drains of the two sensing transistors. The four transistor latch comprises two cross coupled CMOS inverters (i.e., the center node of each CMOS inverter is coupled to both gates of the other CMOS inverter).

When the pull down transistor is activated, the four transistor latch automatically amplifies the voltage differential on the gates of the two sensing transistors. Since the only load on the input signal is the capacitive load associated with the internal nodes that couple the sensing transistors to the four transistor latch, the sense amplifier can amplify and latch very small input signals at very high speed, typically latching in less than two nanoseconds. Thus this sense amplifier significantly improves the access time of a memory device by enabling sensing with very small input signals from a memory cell, and by reducing the delay between sensing and providing an external data output signal. Furthermore, no d.c. current is drawn by the sense amplifier after the input data has been sensed and latched. As a result, relatively powerful transistors can be used in the sense amplifier, which significantly reduces the amount of circuitry needed in the output driver of the memory device incorporating this sense amplifier.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 4:
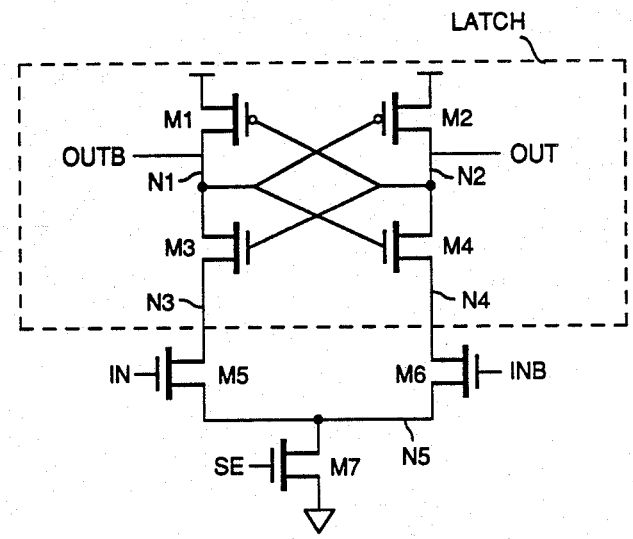
FIG. 4 schematically depicts a dynamic sense amplifier in accordance with the present invention.

Referring to FIG. 4, there is shown the basic components of a dynamic sense amplifier in accordance with the present invention. This sense amplifier employs a dynamic latch (M$_1$–M$_4$) in place of the P-channel current mirror used in the prior art devices shown in FIG. 1.

Input signals IN and INB are coupled to the gate electrodes of two sensing transistors, N-channel transistors M5 and M6. A latch is formed by two cross coupled CMOS inverters M1–M3 and M2–M4, comprising P-channel transistors M1 and M2, and two N-channel transistors M3 and M4. The gate electrodes of M2 and M4 are coupled to node N1, while the gate electrodes of M1 and M3 are coupled to node N2. Nodes N3 and N4 couple the sources of the lower latch devices M3 and M4 to the drains of the input sensing devices M5 and M6, respectively. Pull down transistor M7 is activated when sensing to be performed.

Figure 1:
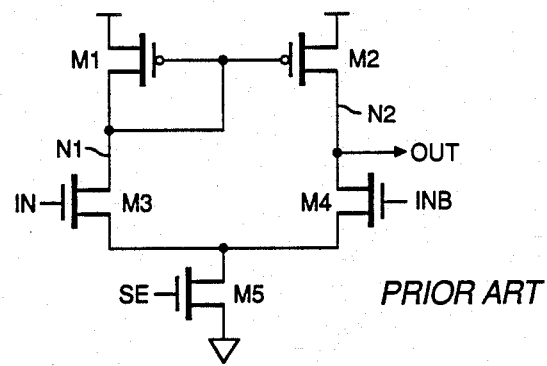
FIG. 1 is schematically depicts a prior art sense amplifier used in MOS static RAMs.
Figure 2:
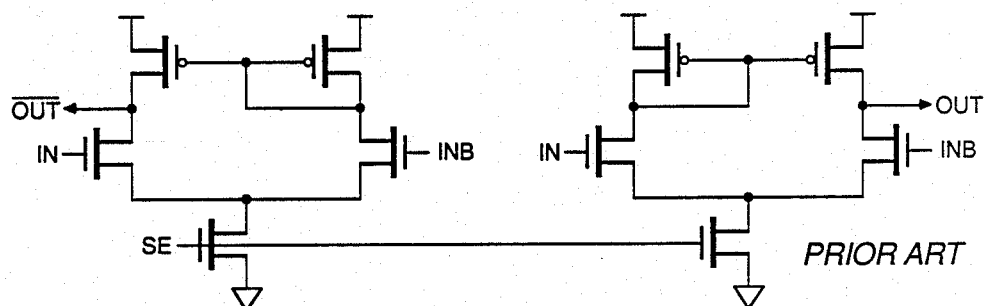
FIGS. 2 and 3 schematically depict additional prior art sense amplifiers.
Figure 3:
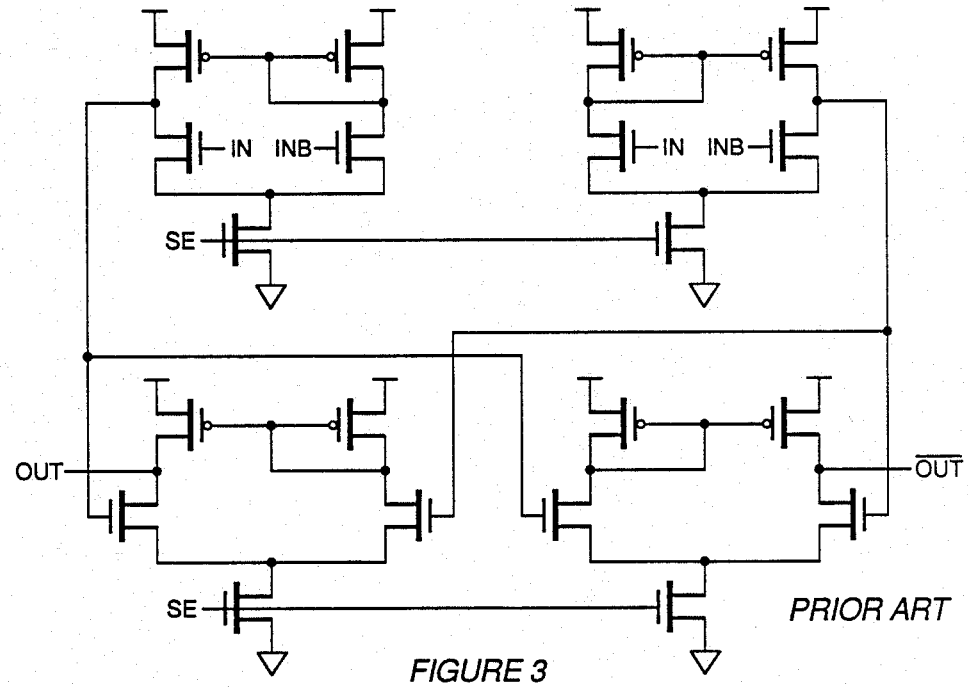

A brief view of this sense amplifier's operation shows that it has several advantages over the prior art devices shown in FIGS. 1–3. Prior to sensing, nodes N1, N2, N3, N4 and N5 are all precharged to V$_{cc}$. The differential inputs IN and INB, on common data out lines, are also precharged and equalized before sensing. When a read cycle begins, the selected memory cell begins to develop a differential on IN and INB before the SE signal is activated. Then, when SE goes high, one of the two sensing transistors M5 or M6 will turn on before the other because one of the two input signals IN or INB will be at a higher voltage.

Note that the accuracy of the initial sensing performed by the sense amplifier, or the minimum input differential needed before sensing begins, is dependent only on the uniformity of the threshold voltages of the two sensing transistors M5 and M6. Only after both sensing transistors M5 and M6 are turned on, by the falling voltage on node N5, will the uniformity of the gains of the two sensing transistors affect the accuracy of the sensing operation. Therefore the present invention is relatively immune to nonuniformities in the gains of the sensing amplifiers.

For the moment, assume that signal IN is 0.1 volts higher than signal INB (i.e., the data is a "1"). Transistor M5 will therefore turn on before M6 when node N5 is initially pulled down. As a result, when sensing begins node N1 will begin pulling down sooner than node N2, and thus node N3 will be pulled down faster than node N4. Looking at transistor M4, this device will be less conductive than transistor M3 because the gate-to-source voltage V$_{GS}$ on M4 will be decreased relative to the gate-to-source voltage on M3 by both the relatively high voltage on node N4 (compared to node N3) and the relatively low voltage on node N1 (compared to node N2). Thus, with transistor M4 beginning to shut off, the voltage on node N2 will quickly rise back towards V$_{cc}$. Finally, the relatively high voltage on node N2 will keep transistor M1 off, reinforcing the rate at which node N1 is pulled low.

In summary, the structure of the sense amplifier shown in FIG. 4 is designed to quickly amplify the signal differential between IN and INB, and to thereby latch the sensed voltages into nodes N2 and N1, where node N2 is labelled OUT because it is latched at a high voltage if the voltage on IN is higher than the voltage on INB.

This sense amplifier has several advantages over the prior art sense amplifiers. First, it is extremely fast because there is intrinsically very little load on the internal switching nodes. The only load on the internal switching nodes is the intrinsic load of the sense amplifier's transistors. A by product of this fast operation is that the sense amplifier is relatively immune to noise—because there is only a very short period of time (the duration of the sensing operation) during which noise can affect its operation.

Secondly, it directly produces differential output signals on nodes N1 and N2 (unlike the sense amplifier in FIG. 1), and these differential outputs latch at full rail to rail output signal levels (V$_{cc}$ and V$_{ss}$). Both of these characteristics permit the use of a relatively simple and powerful output driver.

Thirdly, after the sense amplifier has latched, it consumes no d.c. power because one of the two devices on each side of the latch will be off. Thus, either the pull up transistor (M1 or M2) or the pull down transistor (M3 or M4) will be off on each side of the latch. The complete shut off of d.c. current enables the use of relatively large devices (M1–M4) in the latch, thereby providing strong output drive directly from the sense amplifier and eliminating the need for buffer inverters between the sense amplifier and the output driver.

As noted above, this sense amplifier can be made to latch with much less differential input signal than the sense amplifier shown in FIG. 1. An input differential of 50 to 100 millivolts has been found to be sufficient. By requiring only such a small differential, the delay between memory cell selection and sense amplifier activation can be reduced, and thus the access time of the memory device can be reduced. Finally, this sense amplifier is relatively immune to noise (e.g., V$_{cc}$ spikes) because once the sense amplifier is latched it is very difficult to unlatch it.

Full Sense Amplifier with Precharge and Output Driver

Figure 5A:
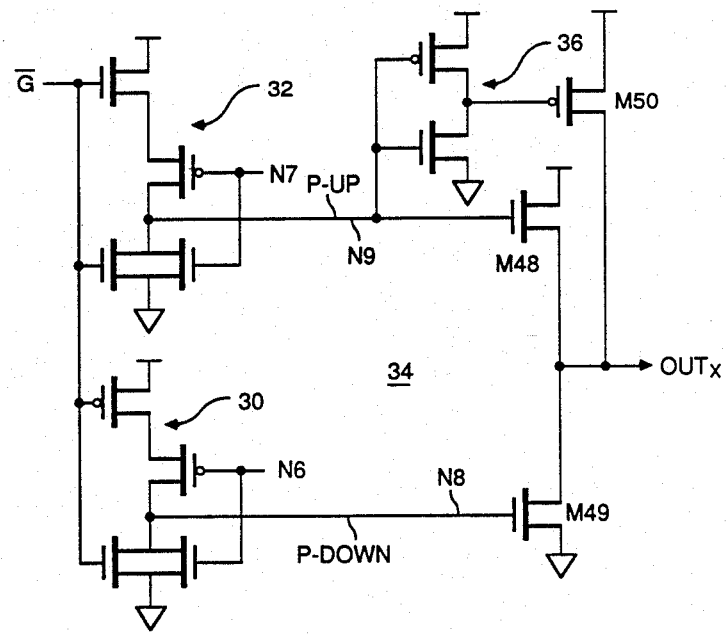
FIGS. 5 and 5A depict a dynamic sense amplifier, including the associated precharge and output driver circuitry used in the preferred embodiment.
Figure 5:
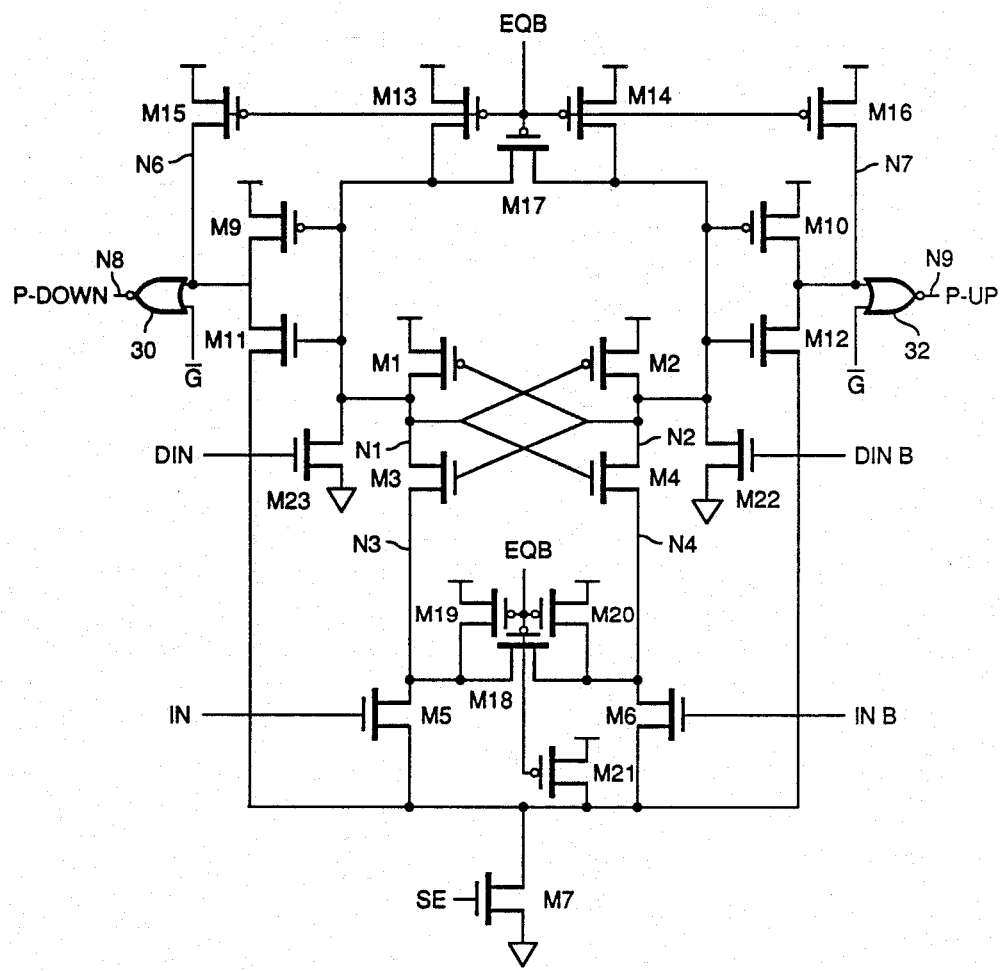

FIG. 5 shows the present invention as it has been implemented on the memory device called the V20C18 made by VLSI Technology, Inc. of San Jose, Calif. Devices M1 through M7 are the actual sense amplifier devices. Devices M8 and M13 through M21 are balancing (or equalizing) and precharge devices. For convenience, devices M1 through M4 are called the first stage of the amplifier and devices M9 through M12 are called the second stage of the amplifier. Note that the sources of transistors M11 and M12 in the second stage of the amplifier are coupled to the common pull down node N5. Devices M9 through M12 are buffer or isolation devices for isolating the latch nodes N1 and N2 from noise generated by the NOR gates 30 and 32. The first and second stages of the amplifier are sized in proportion to their respective loads so that the voltages on nodes N6 and N7 will track or follow the voltages on nodes N2 and N1, respectively. Thus, there will be no penalty or delay in driving the output driver caused by using devices M9 through M12 to isolate the sensing transistors and the inner latch from noise generated by the output circuitry.

Another way to state the sizing requirement for the second stage of the amplifier (to ensure that the use of the second stage does not delay propagation of the sensed signal to the output buffer) is that devices M9 through M12 should be sized so that the ratio of their sizes to the loads they are driving (i.e., the capacitance of nodes N6 and N7) is the same as the ratio of the sizes of devices M1 through M4 to their load (i.e., the capacitance of nodes N1 and N2). While it is best for the devices in the two stages to be sized proportionately, it is generally preferred for the device to load size ratio of the second stage to be within a factor of two (and should always be within a factor of three) of the device to load size ratio of the first stage.

The use of this circuit configuration and device sizing requirement also allows the sense amplifier to drive a relatively large load without incurring any significant speed penalty. The combined benefits of being able to drive relatively large loads without consuming much power (because of the dynamic nature of the circuit) are particularly important in devices providing several parallel output signals, such as in $8k \times 3$ and $64k \times 8$ memories Isolation transistors M9 and M11 comprise a standard CMOS inverter, and transistors M10 and M12 comprise a second CMOS inverter. The NOR gates 30 and 32 also act as inverters when the gating signal $\overline{G}$ is enabled (i.e., low). Thus the combined effect of the buffer transistors M9—M12 and the NOR gates is to simply replicate (by twice inverting) the outputs of the sense amplifier on nodes N1 and N2. In other words, node N8 follows (or is logically equivalent to) node N1, and node N9 follows node N2.

The $\overline{G}$ signal is an internally generated output enable signal, which remains low during normal sensing operations.

In FIG. 5A, there is shown the preferred embodiment of an external output driver 34, and NOR gates 30 and 32. The output driver 34 includes N-channel pull up M48 and pull down M49 devices driven by the P-UP and P-DOWN signals on nodes N9 and N8, and a CMOS inverter 36 for driving an P-channel pull up device M50 with the complement of the P-UP signal so that the driver 34 can drive the external output $OUT_x$ to $V_{cc}$.

As can be seen in FIG. 5, precharging the sense amplifier causes nodes N6 and N7 to be precharged to a high voltage. This causes the outputs of both NOR gates 30 and 32 to go low. The output driver 34 is designed so that precharging the sense amplifier causes the output driver 34 to go into a high impedance state.

Finally, as will be explained in more detail below, devices M22 and M23 are input devices for generating an output signal equal to the input data when input data is being written into the memory.

Memory Organization

Figure 6:
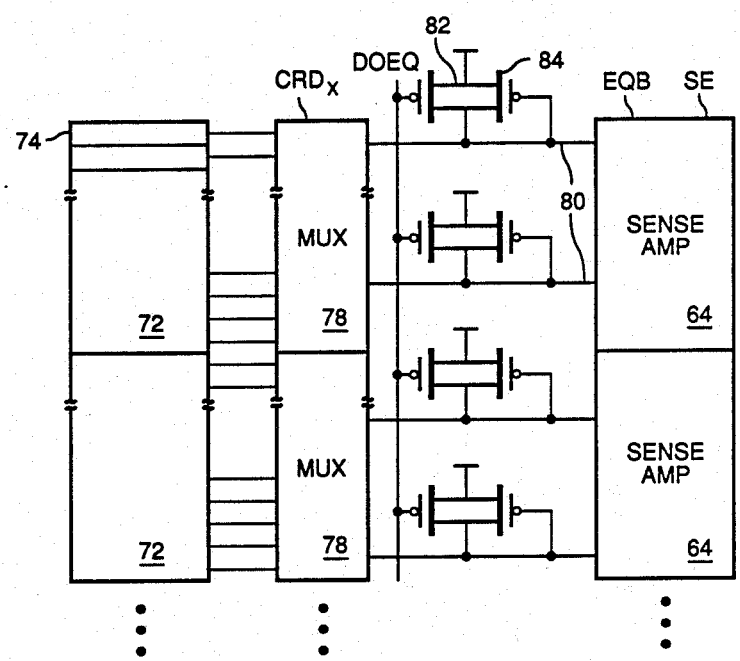
FIG. 6 depicts a memory array incorporating the sense amplifier of the present invention.

Referring to FIG. 6, the preferred embodiment is a memory device 70 containing 64k memory cells which are accessed as an $8k \times 3$ array. The memory cells are divided into sixteen subarrays 72. Each subarray 72 contains sixty-four columns 74, and each column 74 contains sixty-four memory cells coupled to one pair of bit lines 76. A multiplexer 78 couples each subarray 72 to a single pair of common data out lines 80. This memory organization allows the use of bit lines with just sixty-four cells on each bit line pair, which allows the production of a memory device with very small bit line capacitances—approximately 1.0 pf per bit line in the preferred embodiment.

The common data out lines are precharged by a first pull up device 82, and thus equalized, when the DOEQ signal is active (i.e., low). Note that the second pull up device 84 on each common data out line is a small P-channel pull up which helps limit the voltage swings on these lines.

By using dynamic sense amplifiers 64, the memory 70 needs to sample the data on the common data out lines only during the brief period just before and during sensing.

The common data out lines are coupled to one of sixty-four pairs of bit lines only when the column read signal CRD of the selected column is active. Thus, the CRD signal is held inactive (i.e., high) and the DOEQ signal is kept active except during the data sampling period.

Sense Amplifier Operation

Figure 7:
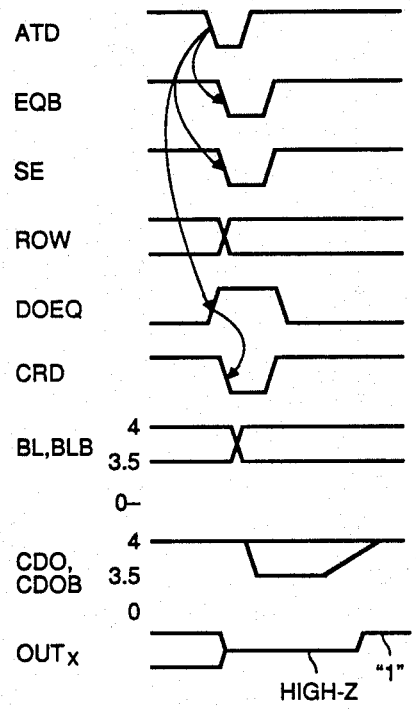
FIG. 7 is a timing diagram for FIG. 5.

The timing diagram in FIG. 7 shows the operation of the memory circuit shown in FIGS. 5 and 6 during a read cycle. For the purposes of this explanation, it is assumed that CRD is the column selection signal for whichever column is selected during the memory cycle. Also, for the purposes of this explanation, it is assumed that the $V_{cc}$ power supply for the memory is a 4 volt power supply.

Looking at the first read cycle, just before an address transition is detected, the common data out (CDO) lines are both held high and are not coupled to bit lines BL and BLB. When an address transition is detected, an ATD signal triggers the sense amplifier's internal equalization signal EQB and temporarily deactivates the sense amplifier's pull down signal SE. Thus, while the sense amplifier is precharging, the location of a new memory cell is being decoded—which causes the data in the selected memory cell to propagate onto the bit lines for the selected cell.

At approximately the same time that the sense amplifier precharge signal EQB is enabled, the common data line equalization signal DOEQ is disabled and then the column read signal CRD for the selected column is enabled so that data in the selected memory cell in that column can propagate onto the IN and INB lines in FIG. 5 for sensing by the sense amplifier.

Since the ROW signal is generated only one to two nanoseconds before the selected CRD signal is activated, the bit lines in the selected column may be in the midst of switching as CRD becomes active. The CDO lines, which were equalized before the ATD signal, need to swing only 100 millivolts before the data is sampled by the sense amplifier 64, which takes approximately 1.5 nanoseconds after the bit lines have developed a differential.

Approximately two nanoseconds after the CRD signal becomes active, the sense amplifier equalization signal EQB is disabled, and then, approximately four nanoseconds after the CRD signal becomes active the sense amplifier pull down signal SE is activated. When the pull down transistor is activated, the four transistor latch M1-M4 automatically amplifies the voltage differential on the gates of the two sensing transistors, typically latching in the data on the CDO line IN and INB less than two nanoseconds.

The external output signal $OUT_x$ initially enters a high impedance state (High-Z in FIG. 7) when the sense amplifier's equalization signal EQB is enabled. As the sense amplifier latches and the latched data is propagated to the output driver, the external output signal is driven to a state matching the sensed data (assumed to be a "1" in FIG. 7).

Writing New Data Into the Memory

Static RAM specifications typically require that when data is written into the memory, the new data must be asserted on the external outputs of the memory. This requirement holds regardless of whether the new data is written into the memory before or after the sense amplifier has already latched the previously stored data. In the present invention, the gates of transistors M21 and M22 are coupled to DIN and DINB, the outputs of the memory's data input buffer. Both DIN and DINB are normally low during read cycles, so M21 and M22 are inactive during normal read cycle operation.

When data is written into the memory, either DIN or DINB goes high, turning on either M21 and M22. The activated transistor (M21 or M22) pulls its associated latch node (N1 or N2) low, which causes the other latch node to be pulled high. Thus the written data is written into the sense amplifier, and is automatically transferred from the sense amplifier to the output driver 34.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A dynamic sense amplifier for use in a static random access memory, said memory including: an array of memory cells arranged in rows and columns; for each said column, a pair of differential bit lines coupled to the memory cells in said column; at least one dynamic sense amplifier having a pair of differential input nodes; and means for selectively coupling said differential input nodes of each said dynamic sense amplifier to one of said pairs of differential bit lines;

said dynamic sense amplifier comprising:
two sensing transistors having gate electrodes coupled to a pair of differential input nodes, both sensing transistors having their source electrodes coupled to a common pull down node;
a pull down transistor for drawing current from said pull down node during sensing operations;
a four transistor latch coupled to the drains of said two sensing transistors for generating a pair of amplified differential signals on two latch output nodes, said four transistor latch comprising two cross coupled CMOS inverters;
transfer means for generating two signals on two isolation nodes which correspond to the voltage levels on said latch output nodes; said transfer means including two CMOS inverters, each said CMOS inverter having gate electrodes coupled to one of said latch output nodes, and a source node coupled to said pull down node;
output driver means coupled to said isolation nodes for generating an output signal on a driver output node, said output signal corresponding to the voltage levels on said latch output nodes; and
precharge means for precharging said latch output nodes and said isolation nodes between sensing operations;
whereby, when the pull down transistor is activated, the four transistor latch automatically amplifies the voltage differential on the gates of the two sensing transistors, generating a pair of differential output signals, and the four transistor latch is closely coupled to the output driver means, providing fast propagation of data read from a memory cell to the driver output node.

2. The dynamic sense amplifier set forth in claim 1, wherein, each of said CMOS inverters in said transfer means has an output node comprising one of said isolation nodes, and said output driver means including two CMOS NOR gates each having an input coupled to one of said two isolation nodes, and two driver transistors having gate electrodes coupled to the outputs of said NOR gates and a common node couples to an external output node of said static random access memory.

3. A dynamic sense amplifier for use in a static random access memory, said memory including: an array of memory cells arranged in rows and columns; for each said column, a pair of differential bit lines coupled to the memory cells in aid column; at least one dynamic sense amplifier having a pair of differential input nodes; and means for selectively coupling said differential input nodes of each said dynamic sense amplifier to one of said pairs of differential bit lines;

said dynamic sense amplifier comprising:
two sensing transistors having gate electrodes coupled to a pair of differential input nodes, both sensing transistors having their source electrodes coupled to a common pull down node;
a pull down transistor for drawing current from said pull down node during sensing operations;
a four transistor latch coupled to the drains of said two sensing transistors for generating a pair of amplified differential signals on two latch output nodes, said four transistor latch comprising two cross coupled CMOS inverters; each of said CMOS inverters comprising a P-channel load transistor and an N-channel transistor, the drains of both of said transistors being coupled to one end of said latch output nodes, and the gates of both of said transistors being coupled to the latch output node of the other CMOS inverter;
isolation means coupled to said latch output nodes for generating two signals on two isolation nodes which correspond to the voltage levels on said latch output nodes;
output driver means coupled to said isolation means for generating an output signal on a driver output node, said output signal corresponding to the voltage levels on said latch output nodes; and
precharge means for precharging said latch output nodes and said isolation nodes between sensing operations;
whereby said four transistor latch is closely coupled to said output driver means, providing fast propagation of data read from a memory cell to said driver output node.

4. The dynamic sense amplifier set forth in claim 3, wherein said isolation means includes two CMOS inverters, each said CMOS inverter of said isolation means having gate electrodes coupled to one of said latch output nodes, and a source node coupled to said pull down node.

5. A dynamic sense amplifier for use in a static random access memory, said memory including: an array of memory cells arranged in rows and columns; for each said column, a pair of differential bit lines coupled to the memory cells in said column; at least one dynamic sense amplifier having a pair of differential input nodes; and means for selectively coupling said differential input nodes of each said dynamic sense amplifier to one of said pairs of differential bit lines;
  said dynamic sense amplifier comprising:
    two sensing transistors having gate electrodes coupled to a pair of differential input nodes, both sensing transistors having their source electrodes coupled to a common pull down node;
    a pull down transistor for drawing current from said pull down node during sensing operations;
    a four transistor latch coupled to the drains of said two sensing transistors for generating a pair of amplified differential signals on two latch output nodes, said four transistor latch comprising two cross coupled CMOS inverters;
    transfer means for generating two signals on two isolation nodes which correspond to the voltage levels on said latch output nodes; said transfer means including two CMOS inverters, each said CMOS inverter having gate electrodes coupled to one of said latch output nodes, and a source node coupled to said pull down nodes;
    output driver means coupled to said isolation nodes for generating an output signal corresponding to the voltage levels on said latch output nodes; and
    precharge means for precharging said latch output nodes and said isolation nodes between sensing operations;
    wherein each of said CMOS inverters in said transfer means has an output node comprising one of said isolation nodes, and the ratio of the sizes of the transistors in each of said CMOS inverters in said transfer means to the capacitance on said output node is within a factor of two of the ratio of the sizes of the transistors in each of said CMOS inverters in said four transistor latch to the capacitance on said latch output nodes;
    whereby said four transistor latch is closely coupled to said output driver means, providing fast propagation of data read from a memory cell to the output of said output driver.

6. A dynamic sense amplifier for use in a static random access memory, said memory including an array of memory cells arranged in rows and columns, with the memory cells in each column coupled to a pair of differential bit lines; a multiplicity of said dynamic sense amplifiers, each coupled to a pair of differential common data out lines; and multiplexer means coupled to each said pair of common data out lines and to a predefined set of said bit line pairs, for selectively coupling each said common data out line pair to a selected one of said predefined set of bit line pairs;
  said dynamic sense amplifier comprising:
    two sensing transistors, each having a gate electrode coupled to one of a pair of differential common data out lines, both sensing transistors having their source electrodes coupled to a common pull down node;
    a pull down transistor for drawing current from said pull down node during sensing operations; and
    a four transistor latch coupled to the drains of said two sensing transistors for generating a pair of amplified differential signals on two latch output nodes, said four transistor latch comprising two cross coupled CMOS inverters;
    transfer means for generating two signals on two isolation nodes which correspond to the voltage levels on said latch output nodes; said transfer means including two CMOS inverters, each said CMOS inverter having gate electrodes coupled to one of said latch output nodes, and a source node coupled to said pull down node;
    whereby, when the pull down transistor is activated, the four transistor latch automatically amplifies the voltage differential on the gates of the two sensing transistors, generating a pair of differential signals on said isolation nodes suitable for driving an output driver.

7. The dynamic sense amplifier set forth in claim 6, further including precharge means for precharging said latch output nodes and said isolation nodes between sensing operations; and output driver means coupled to said isolation nodes for generating a output signal and a driver output node, said output signal corresponding to voltage levels on said latch output nodes;
    wherein said output driver means includes two CMOS NOR gates each having an input coupled to one of said two isolation nodes, and two driver transistors having gate electrodes coupled to the outputs of said NOR gates and a common node coupled to an external output node of said static random access memory; said output driver means having a high impedance output when said precharge means precharges said latch nodes and said isolation nodes between sensing operations.

8. The dynamic sense amplifier set forth in claim 6, wherein the ratio of the sizes of the transistors in each of said CMOS inverters in said transfer means to the capacitance on said isolation nodes is within twenty percent of the ratio of the sizes of the transistors in each of said CMOS inverters in said four transistor latch to the capacitance on said latch output nodes.

9. A dynamic sense amplifier for use in a static random access memory, said memory including an array of memory cells arranged in rows and columns, a pair of differential bit lines coupled to the memory cells in each column, at least one dynamic sense amplifier having a pair of differential input nodes, and means for selectively coupling said differential input nodes of each said dynamic sense amplifier to one of said pairs of differential bit lines;
  said dynamic sense amplifier comprising:
    two sensing transistors, each having a gate electrode coupled to one of a pair of differential input nodes and a source electrode coupled to a common pull down node;
    a pull down transistor for drawing current from said pull down node during sensing operations;
    a four transistor latch coupled to the drains of said two sensing transistors for generating a pair of amplified differential signals on two latch output nodes, said four transistor latch comprising two cross coupled CMOS inverters;
    transfer means for generating two signals on two isolation nodes which correspond to the voltage levels on said latch output nodes; said transfer means including two CMOS inverters, each said CMOS inverter having a gate electrode coupled to one of said latch output nodes and a source node coupled to said pull down node; and
    output driver means coupled to said isolation nodes for generating an output signal on a driver output node, said output signal corresponding to the voltage levels on said latch output nodes
    whereby, when the pull down transistor is activated, the four transistor latch automatically amplifies the voltage differential on the gates of the two sensing transistors, generating a pair of differential output signals corresponding to the voltage differential on said pair of differential input nodes.

* * * * *